United States Patent [19]
Tsuchiya et al.

[11] 4,449,142
[45] May 15, 1984

[54] SEMICONDUCTOR MEMORY DEVICE

[75] Inventors: Toshiaki Tsuchiya, Iruma; Manabu Itsumi, Hoya, both of Japan

[73] Assignee: Nippon Telegraph & Telephone Public Corporation, Tokyo, Japan

[21] Appl. No.: 230,460

[22] Filed: Feb. 2, 1981

[30] Foreign Application Priority Data

Oct. 8, 1980 [JP] Japan ............... 55-139917
Oct. 25, 1980 [JP] Japan ............... 55-149562

[51] Int. Cl.$^3$ ............ H01L 27/04; G11C 11/40
[52] U.S. Cl. ........................... 357/23; 357/22; 357/42; 365/149; 365/150
[58] Field of Search ............ 357/23 C, 24, 41, 22, 357/42; 365/149, 150

[56] References Cited

U.S. PATENT DOCUMENTS

| | | | |
|---|---|---|---|
| 3,639,813 | 2/1972 | Kamoshida et al. | 357/42 |
| 3,918,070 | 11/1975 | Shannon | 357/30 |
| 4,074,302 | 2/1978 | Brewer | 357/59 |
| 4,161,741 | 1/1979 | Collet et al. | 357/41 |
| 4,291,391 | 9/1981 | Chatterjee et al. | 365/184 |

FOREIGN PATENT DOCUMENTS

WO79/00474 7/1979 PCT Int'l Appl. ............ 365/182

OTHER PUBLICATIONS

Lee, IBM Tech. Disclosure Bulletin, vol. 19, No. 11, Apr. 1977, pp. 4103–4105.
Chang et al., IBM Tech. Disclosure Bulletin, vol. 16, No. 1, Jun. 1973, p. 255.
Electronics, Apr. 1, 1976, pp. 74–81.
Koyanagi et al., IEEE Int. Electron Dev. Meeting, Technical Digest, Dec. 3, 1978, pp. 348–351.
IEEE Journal of Solid-State Circuits, vol. SC-7, No. 5, Oct. 1972, pp. 336–340.

*Primary Examiner*—William D. Larkins
*Attorney, Agent, or Firm*—Blakely, Sokoloff, Taylor & Zafman

[57] ABSTRACT

A semiconductor memory device comprises a gate electrode provided via a gate insulating film on a semiconductor layer formed on a substrate and two diffused semiconductor regions provided to form a field effect transistor together with the gate electrode. An electrical charge is supplied to one of the diffused regions from the other region to thereby vary a width of a space charge layer appearing around the one diffused region so that informations "1" and "0" are selectively stored in the device. The stored information is read-out by detecting presence or absence of a buried channel between the space charge layer and the substrate.

13 Claims, 23 Drawing Figures

SEMICONDUCTOR MEMORY DEVICE

BACKGROUND OF THE INVENTION

This invention relates to a semiconductor memory device.

Though there have been proposed various kinds of semiconductor memory devices, it still remains as a theme of research and development to obtain such a semiconductor memory device of the type having dynamic random access memory as enjoying both high operational speed and high packing density. For example, as a MOS (metal-oxide semiconductor) type dynamic random access memory among the above-said semiconductor memory devices, so-called single-transistor memory cell is of the major trend in that field of the technology. This cell is composed of one MOS type field effect transistor (MOSFET) and one capacitor.

A memory cell of this kind is disclosed, for example, in IEEE JOURNAL OF SOLID-STATE CIRCUITS, Vol. SC-7, No. 5 October 1972, pages 336 to 340. The described memories appear to have advantages in attaining high packing density owing to the small number of requisite component elements. In such memories, however, the electric charge written into a capacitor is directly detected in read-out which results in the following problems. That is, in this structure, it is required to minimize the area of the capacitor to realize large memory capacity as well as high packing density. As a result an output signal read-out from the memory is accordingly weakened in magnitude to such an extent as in the range of tens mV or hundreds mV. This means that a circuit in the succeeding stage, i.e. a sense amplifier requires to be designed as enough sensitive as detecting the minute output signal of the memory. To use such a sensitive sense amplifier demands to amplify the signals using complex clock pulses. Of course there is naturally a limit of circuit technology in augmenting the sensitivity of a sense amplifier. Particularly, considering that the short channel MOSFET's will occupy the major part of the coming semiconductor elements for memories, it will be difficult to enhance the sensitivity of a sense amplifier without degrading the operation speed. As seen from the above this kind of memory meets difficulty in realizing a memory device with high speed and high packing density.

Another example of a semiconductor memory device suited for dynamic random access is found in U.S. Pat. No. 4,161,741 issued on July 17, 1979 in which a memory cell comprises in combination MOSFET's Junction type FET's (JFET) and a capacitor so that an electrical charge stored in the capacitor is detected indirectly. Though a semiconductor memory device of this type has been improved relative to the above-mentioned prior art of the single-transistor memory cell in terms of obtaining high speed and a large read-out output, the structure of this memory to apply clock pulses to a capacitor having relatively large capacitance causes propagation delay due to interconnection line resistance and interconnection line capacitance of the wiring to apply the clock pulses to the capacitor and also due to capacitance of the storage capacitor itself, which will be a problem in attaining higher speed. Further, only depletion type MOSFET's can be used in the semiconductor memory device of this type resulting in a drawback when fabricating an integrated device with the MOSFET. Also in an aspect of reducing the size of one memory cell, this memory device is disadvantageous since it requires, in addition to the minimum component elements for a memory function, a refresh circuit which is used only after several reading-out operations.

SUMMARY OF THE INVENTION

It is, therefore, a general object of the present invention to provide an improved semiconductor memory device suited for high speed operation and high packing density.

It is another object of the invention to provide a semiconductor memory device having a relatively simple structure and capable of writing and reading information with a relatively simple timing arrangement.

It is further object of the invention to provide a semiconductor memory device capable of producing a large read-out output which dispenses with a very sensitive sense amplifier.

It is yet another object of the invention to provide a semiconductor memory device which can be constituted by a MOSFET of either depletion type or enhancement type.

It is yet another object of the invention to provide a semiconductor memory device which not only overcomes the difficulty in the conventional single-transistor memory cell but also enables the device to require only one contact hole similarly as in a typical single-transistor memory cell.

It is yet another object of the invention to provide a semiconductor memory device which not only overcomes the difficulty in the conventional single-transistor memory cell but also enables the device to simplify the wiring in one memory cell similarly as in a typical single-transistor memory cell.

To achieve these object, a semiconductor memory device according to the invention comprises a gate electrode formed via an insulating film on a surface of a semiconductor region of a first conductivity type provided on a substrate, a diffused region of a second conductivity type formed in said semiconductor region at one end of said gate electrode and a buried channel portion formed at a portion of said semiconductor region located below a charge storage portion which is formed in connection with the other end of said gate electrode, thereby obtaining a read-out signal by detecting a current at said channel portion which varies in accordance with a stored charge.

In one aspect of the present invention, there is provided a semiconductor memory device which comprises a substrate, a first semiconductor region of a first conductivity type formed on said substrate, a gate insulating film formed on said first semiconductor region, a gate electrode provided on said gate insulating film, a second semiconductor region of a second conductivity type formed in said first semiconductor region in connection with one end of said gate electrode, a charge storage portion formed apart from said second semiconductor region and in connection with the other end of said gate electrode, and means for detecting conductivity of a buried channel which is formed between said substrate and a space charge region varied in accordance with an amount of electric charge supplied to said charge storage portion. This charge storage portion may be a diffused region of a second conductivity type provided in the first semiconductor region at the other end of the gate electrode, alternatively it may be provided between an electrode isolated from the gate electrode and the semiconductor region under said isolated electrode.

DETAILED DESCRIPTION OF THE PREFERRED EMBODIMENTS

Figure 1:
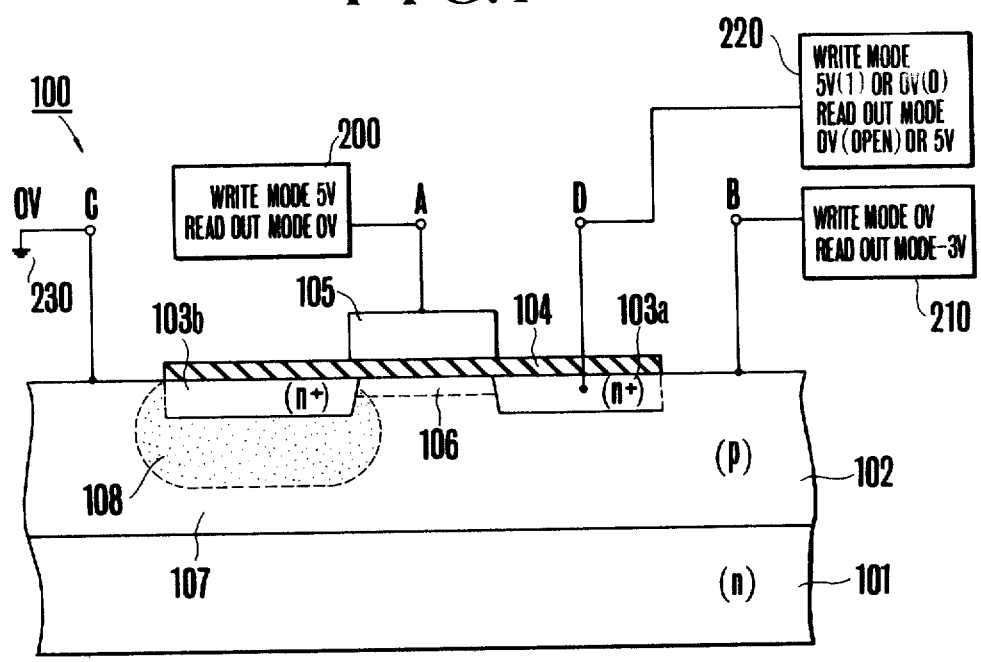
FIG. 1 is a sectional view showing an embodiment of a semiconductor memory device according to the invention.

FIG. 1 shows an embodiment of a semiconductor memory device, which is particularly applied to a memory cell composed of an N channel and enhancement type insulated-gate FET or MOSFET which cell is located in each memory site arranged in a matrix. The depicted semiconductor memory device 100 utilizes an N type semiconductor substrate 101 on which a P type semiconductor layer 102 is formed by appropriate known technique. On a principal surface of this P type semiconductor layer 102 there are provided two N+type diffused regions 103a and 103b apart from each other. An electrode 105 serving as a gate of a MOSFET is provided via a gate insulating film 104 on the principal surface of the P semiconductor layer 102 sandwiched between the two N+ diffused regions 103a and 103b. The electrode 105 is connected to a terminal A of a word line in a write mode (hereinafter briefly word line terminal). On the P semiconductor layer 102 there are provided two electrodes separately from each other in a manner to sandwich therebetween the N+ diffused regions 103a and 103b, from which electrodes are connected to a bit line terminal B in a read-out mode and a grounded terminal C respectively. These two electrodes, though not shown, are formed by conventional processing to ensure ohmic contacts to the P semiconductor layer. Similarly another electrode not shown is formed on the N+ diffused region 103a using known processing to form a through hole so that this electrode is connected to a terminal D of a bit line in a write mode and a word line in a read-out mode (hereinafter briefly bit/word line terminal). A channel 106 of the MOSFET is thus formed between the N+ diffused regions 103a and 103b while a buried channel 107 is provided in the P semiconductor layer 102 below the N+ diffused region 103b. A space charge region 108 spreading from the N+ diffused region 103b to the buried channel 107 is varied in this width according to an amount of electric charge supplied to the N+ diffused region 103b. Memory cells thus constructed are arranged at the respective crossings of the matrix. Here, explanation is made with respect to a selected cell. Namely, in FIG. 1, the terminal A is connected to the word line and a signal source 200 producing a voltage of 5 V in write mode and a voltage of 0 V in read-out mode, the terminal B to the bit line and a signal source 210 producing a 0 V voltage in write mode and a −3 V voltage in read-out mode, the terminal D to the bit/word line and an information source 220 producing a 5 V voltage (information "1") or a 0 V voltage (information "0") in write mode and a 0 V voltage (or opened) in read-out mode, and the terminal C to a voltage source for constantly providing the ground potential. In case of a non-selected cell, the terminal A is supplied with 0 V in write mode and the terminal D is supplied with 5 V.

Figure 2:
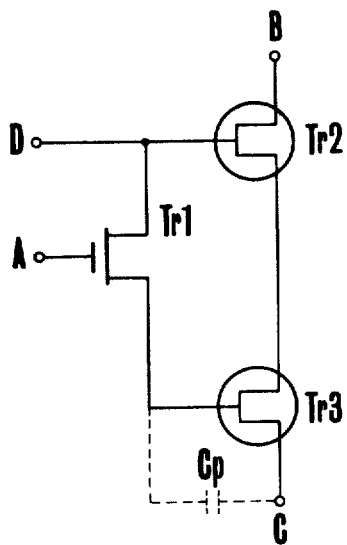
FIG. 2 is an equivalent circuit diagram of the device in FIG. 1, FIGS. 3A through 3D, 4A and 4B are sectional views useful to explain the operation of the device in FIG. 1, FIGS. 5, 6A and 6B are views showing a concrete example of a semiconductor memory device according to the invention.

FIG. 2 is an equivalent circuit diagram of the memory cell shown in FIG. 1. As seen from this Figure the memory cell according to the invention comprises one MOSFET Tr1 and two equivalent JFET Tr2 and Tr3. More particularly the region 103a of the semiconductor memory 100 shown in FIG. 1 corresponds to a drain of the MOS transistor Tr1 and a gate of the Junction transistor Tr2 while the region 103b to a source of the transistor Tr1 and a gate of the junction transistor Tr3. The gate and the drain of the transistor Tr1 are connected to the word line terminal A and the bit/word line terminal D respectively. The drain of the transistor Tr2 is connected to bit line B while the source of the transistor Tr2 and the drain of the transistor Tr3 are interconnected. Further source of the transistor Tr3 is connected to the grounded terminal C. Thus, when the charge carriers are injected from the terminal D to the drain of the MOSFET Tr1, they are transferred to the source of the MOSFET Tr1 through its channel (106 in FIG. 1). Due to the space charge layer or depletion layer 108 spreading around the region 103b, there is formed a capacitor Cp that is charge storage means between the source of the MOSFET Tr1 and the first semiconductor layer 102 as shown by dashed lines in FIG. 2. Accordingly the abovesaid charge transfer from the drain to the source of the MOSFET Tr1 causes the charge to be stored at the capacitor Cp. In compliance with this the space charge layer 108 shown by dotted region in FIG. 1 spreads more and, as a result, the buried channel 107 provided under this space charge layer 108 is narrowed in width (in the vertical direction in FIG. 1). This means the conductivity between the terminals B and C is varied accordingly.

Figure 3A:
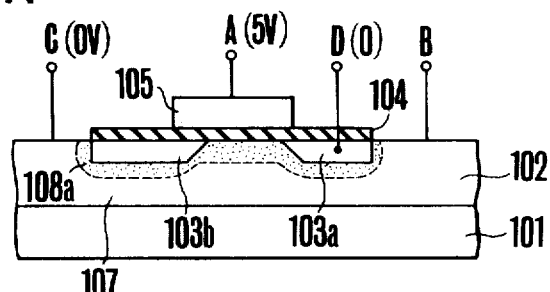
Figure 3B:
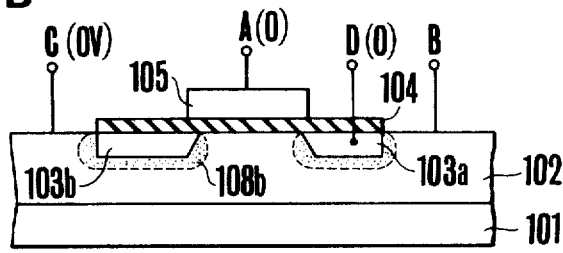

The operational principle for the above constructed semiconductor device to operate as a memory cell is hereinafter explained referring to FIGS. 3A to 3D, 4A and 4B. In FIG. 3A the terminal D (the bit line in writing) is held at 0 potential (information "0") while the terminal A (the word line in writing) is supplied with a potential greater than a threshold voltage $V_{TH}$ of the MOSFET, in other words supplied with 5 V to thereby render the MOSFET Tr1 conductive. Then the potential of the region 103b is zero in coincidence with that of the region 103a and, as a result, only a slight space charge layer 108a is formed between the regions 103b and the layer 102 due to a built-in potential or diffusion potential therebetween thus securing a stage that the space charge layer 108a does not reach the substrate. Here the terminal A is supplied with a potential under $V_{TH}$, i.e. 0 V to render the MOSFET Tr1 nonconductive as seen in FIG. 3B. Consequently there is established between the region 108b and the substrate 101 a region of large conductivity that is the buried channel 107 which means that a conductive state has been written between the region 103b and the substrate 101.

Figure 3C:
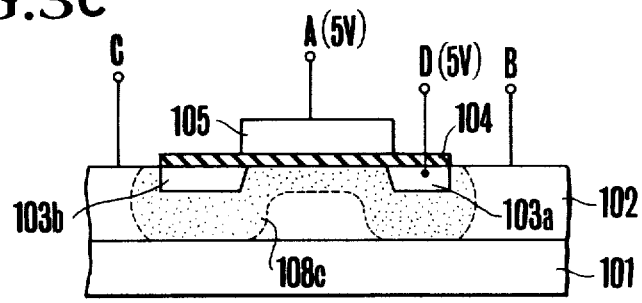
Figure 3D:
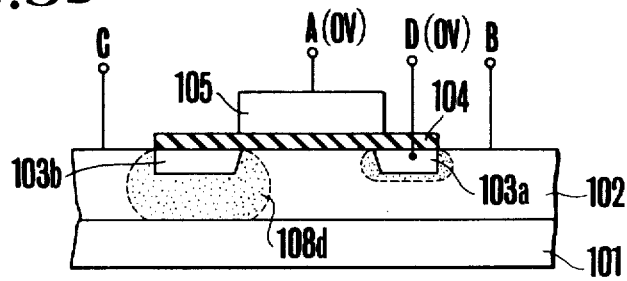

On the other hand, as seen in FIG. 3C, if the terminal D is supplied with a positive potential, i.e. 5 V (information "1") and the terminal A is supplied with 5 V, the MOSFET Tr1 is rendered conductive so that the potential of the region 103b is also upraised to a positive potential being tugged by that of the region 103a. This causes a large space charge layer 108c to spread between the regions 103b and the substrate 101 thus securing a state that this space charge layer 108c reaches the substrate 101. Then, if the terminal A is supplied with 0 V potential under $V_{TH}$ to render the MOSFET Tr1 nonconductive and the terminal D is also supplied with 0 V potential, it is possible to keep the region 103b at a positive potential for a certain time period thus still maintaining a pinch-off state in which the space charge layer 108d between the region 103b and the semiconduct layer 102 reaches this substrate. Consequently a region of very small conductivity exists between the region 103b and the substrate 101 for a certain holding time which means a nonconductive state has been written between the terminals B and C. As described above, in this embodiment, binary informations of a conductive state and a nonconductive state between the terminals B and C are written by the potentials selectively applied to the terminals A and D.

Figure 4A:
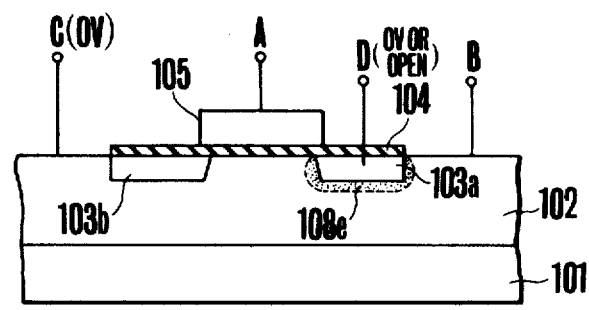
Figure 4B:
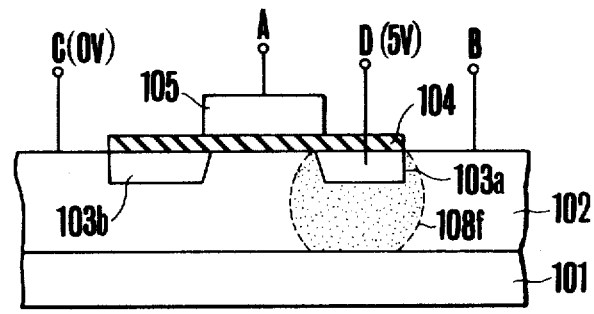

Next, a read-out operation will be explained with reference to FIGS. 4A and 4B. To read-out the information the terminal D (word line in read-out) of a cell to be selected is held at 0 V or opened to suppress the width of a space charge layer 108e between the region 103a and the layer 102 within a slight range as seen in FIG. 4A so that the space charge layer 108e may not reach the substrate 101. On the other hand, the other word line D in read-out is each held at a positive potential of 5 V to ensure a a pinched-off state where a space charge region 108f between the region 103a and the substrate 101 reach the substrate 101 as shown in FIG. 4B. As a result the non-selected cell connected to the bit line B in read-out which in turn is connected to the cell to be selected is forced to a nonconductive state between the terminals B and C as shown in FIG. 4B because of the space charge layer 108f between the region 103a and the substrate 101 and irrespective of the information of the cell. Here, if an appropriate potential difference is applied between the terminals B and C of the selected cell, in this example 0 V to the terminal C and −3 V to the terminal B, conduction or nonconduction between the terminals B and C of such cell is detected in accordance with conduction or nonconduction of the buried channel 107 of MOSFET since the expansion of the space charge layer 108e between the region 103a and the substrate 101 is only slight as shown in FIG. 4A. Accordingly the information of the selected cell is read-out at the bit line B in read-out. In the above described read-out operation the terminal A is always held at 0 V.

If the terminal B is given with a positive potential relative to the terminal C in the above read-out operation, there will be inconveniences that the semiconductor layer 102 and the region 103a are forward biased when the terminal D is at 0 V and that the space charge layer formed around the region 103b has shrunk. Therefore the bit line terminal B is applied with a negative potential relative to the grounded terminal C as explained before. By applying such potential difference between the terminals B and C an information "1" is detected since no current is allowed to flow between both the terminals when the buried channel 107 has been expelled by pinching-off action of the space charge layer 108. Contrarily, if the buried channel 107 is maintained to exist, an information "0" is detected due to a current flowing between the terminals B and C.

As seen from the above according to the invention, it is possible to obtain a large read-out output signal without using a capacitor of large capacitance. This is because the read-out of information is carried out by detecting a current through the buried channel 107 which is varied according to the stored charge and not by directly detecting the stored charge as in a conventional popular manner. Accordingly the memory device necessitates neither costly sense amplifier enough sensitive to amplify a weak output signal read-out from the memory cell nor complex clock pulses determined considering the operation timings. It is also an advantage of the invention that a propagation delay stemming from a storage capacitor at the writing and read-out operations of the memory is not brought about because such a structure as directly applying clock pulses to the capacitor is adroitly evaded. This permits the memory device of the invention to enjoy a superior performance in terms of high speed to any conventional memory device. Further in this memory device, the cell comprises the minimum number of component elements necessary for writing and reading an information so that the memory cell requires only such a small area as occupied by one MOSFET even if the cell includes two equivalent JFET's, thus realizing a structure most suited for a high speed operation. The memory structure of the invention enables also a semiconductor layer constituting the device to be considerably reduced in thickness which leads alleviation of an amount of charge collection causing soft errors due to the charges yielded by alpha particles from the radioactive substances such as uranium, thorium etc. contained in ceramics used to envelop an IC chip. The memory cell of the invention is four times more resistive against the soft errors by alpha particles than the conventional single-transistor memory cells.

Figure 5:
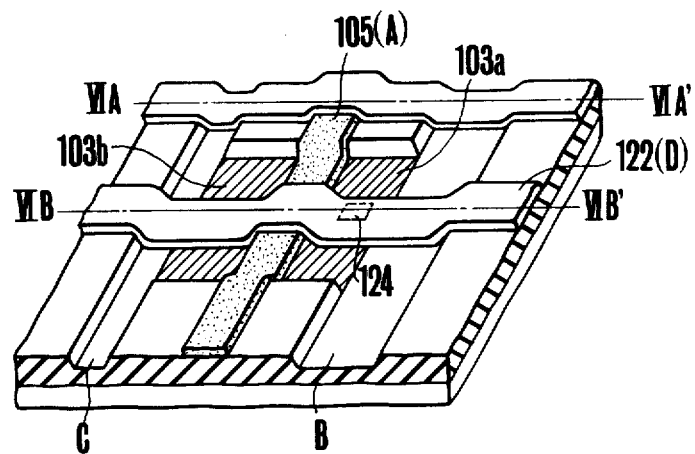
Figure 6A:
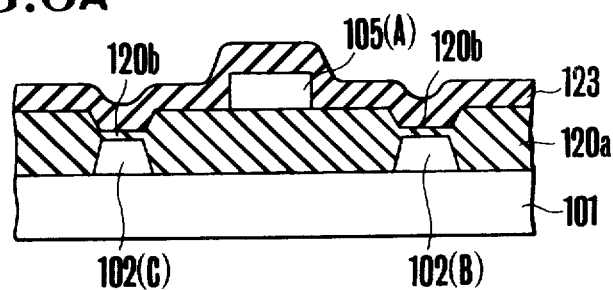
Figure 6B:
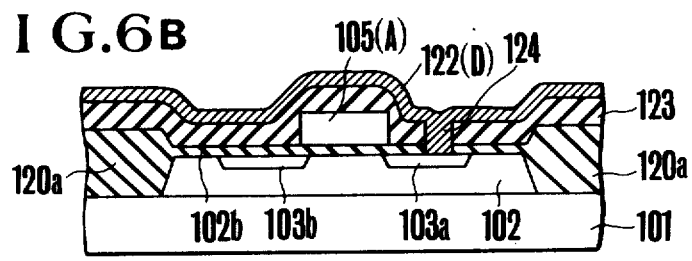

FIGS. 5, 6A and 6B show a concrete example of a structure of one memory cell embodying a semiconductor memory device according to the invention, wherein as the terminal C and the bit line B in read-out is used a semiconductor region 102 which including the terminals B and C is entirely surrounded by insulating layers 120a and 120b and a semiconductor substrate 101 of the opposite conductivity to that of the region 102. The terminals B and C shown also in FIG. 1 are provided in the semiconductor 102 while the terminal A used concurrently as a gate electrode 105 is formed of a metal or a polycrystalline silicon layer including impurity. On this layer 105 is disposed a conductive layer 122 serving as the terminal D in such a direction as crossing the layer 105 with an inter-layer insulating film 123 therebetween. The conductive layer 122 is connected to the region 103a through a contact hole 124 piercing the insulating layers 123 and 120b. It is to be noted that in this arrangement in FIGS. 5, 6A and 6B only one contact hole is used for each memory cell. It will be also understood from this embodiment particularly in FIG. 5 that a chip area per cell of the memory cell according to the invention substantially equals to an area occupied by one MOSFET which is considerably smaller than that of the conventional single-transistor memory cell.

Assuming now that in the embodiment of FIG. 1 an impurity concentration ($N_A$) of the semiconductor 102 is $P=5\times10^{15}$ cm$^{-3}$, a threshold voltage ($V_{TH}$) of the MOSFET is 0.5 V, and a writing voltage ($V_D$) of the terminal D and a gate voltage ($V_A$) of the terminal A are 0 V and 5 V respectively, the dimentional requirements of the device are as follows. An expansion width W of the space charge layer 108 growing from the region 103b to the semiconductor layer 102 is expressed as $$W = \sqrt{\frac{2K \cdot \epsilon_0 \cdot (V_{bi} + V)}{\zeta \cdot N_A}} \quad (1)$$

where $\epsilon_o$ is Free space permittivity, K Dielectric constant of the layer 102, q Magnitude of electronic charge, $V_{bi}$ Built-in potentil difference, and V a potential difference between the region 103b and the layer 102. At the writing condition of a conductive state, i.e. when $V_A=5$ V and $V_D=0$ V, the potential of the regon 103b is also 0 V and then the width W is 0.5 μm since V=0 in the equation (1). At the writing condition of a nonconductive state, i.e. $V_A=5$ V and $V_D=5$ V, the potential of the region 103b substantially equals to the potential of the region 103a subtracted by $V_{TH}$ of the MOSFET. Then the width W is 1.2 μm since in the equation (1) $V=V_D-V_{TH}=4.5$ V. Accordingly, if the depth of the region 103b is selected at about 0.3 μm, the depth of the layer 102 should be in the range of 0.8 to 1.5 μm with the both figures inclusive.

Figure 7:
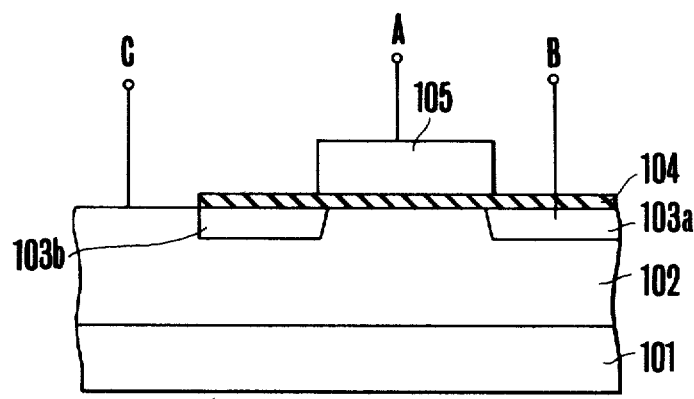
FIGS. 7 through 12 are views showing modifications of a semiconductor device according to the invention.

FIG. 7 shows a modification of a semiconductor memory device according to the invention in which the terminals D and B in FIG. 1 are made common. The writing operation of this embodiment is same as in FIG. 1 while the read-out is carried out by applying a forward potential difference at the PN junction between the teminal B common with the terminal D and the terminal C so as to detect conduction or nonconduction therebetween. This combined usage of the terminals D and B shown in FIG. 1 enables to dispense with a terminal corresponding to the bit line terminal B in read-out in FIG. 1 resulting in reduction of the number of wirings and, therefore, an area of the cell. It also contributes to shorten a distance between the read-out terminals and to obtain a large read-out current due to reduction of the channel resistance. As a result further high speed operation of the device is realized.

Figure 8:
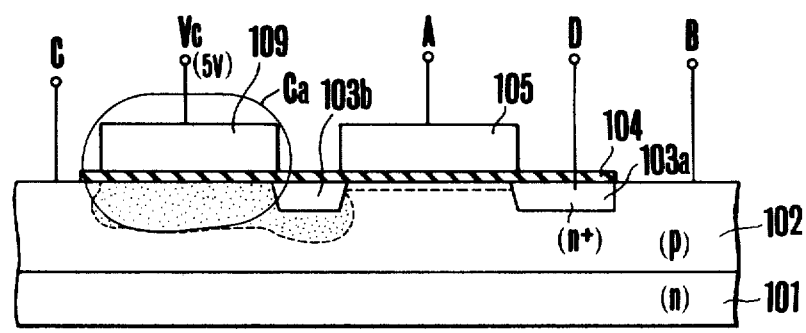

FIG. 8 is another embodiment of a semiconductor memory device according to the invention in which a MIS (metal-insulator semiconductor) type capacitor having a capacitor electrode is employed in such a way that a charge storage region includes a capacitor Ca provided in addition to and adjacent to the diffused region 103b in the preceding embodiment. In the following description of FIG. 8 same or similar parts to FIG. 1 are given with same reference characters to omit explanations thereof. On a surface of the P semiconductor layer 102 between the N+ diffused region 103b and the electrode area connected to the grounded terminal C is provided one electrode 109 of the capacitor Ca via the gate insulating film 104, which electrode 109 is connected to an electrode terminal Vc. In the semiconductor device constructed as above the electrode terminal Vc of the capacitor Ca is always supplied with a potential of, for example, 5 V. Consequently the charge storage portions are realized by not only the diffused region 103b but also a surface portion of the P semiconductor layer 102 just below the one electorde 109 of the capacitor Ca. Particularly the growth of the space charge layer 108 at the buried channel 107 is facilitated by applying the abovesaid voltage to the electrode terminal Vc of the Capacitor Ca. Excepting this the operations of writing and read-out are performed in a precisely same way as in FIG. 1. Though the one electrode 109 of the capacitor Ca is provided in this embodiment, such electrode of the capacitor Ca is simply applied with a constant voltage at all times in good contrast with the conventional semiconductor memory devices in which many gates are coupled with a common wiring to be driven by clock pulses, as typically disclosed in the U.S. Pat. No. 4,161,741, resulting in a considerable propagation delay. This feature of the present invention gives an advantage to get a high speed operation.

Figure 9:
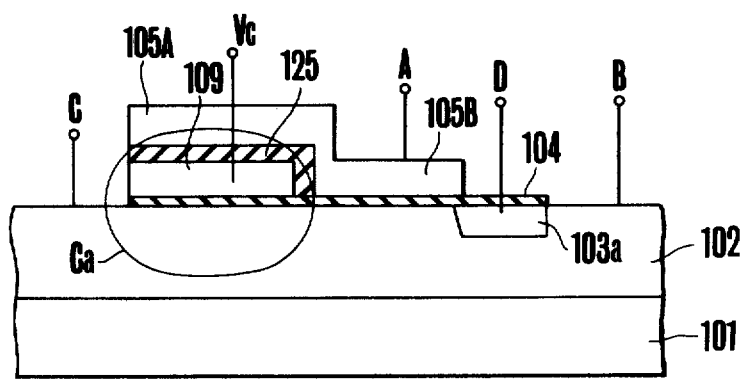

FIG. 9 is still another embodiment of the invention in which the capacitor Ca shown in FIG. 8 is formed by double-layered polycrystalline silicon. In this embodiment the capacitor Ca is disposed without the diffused region 103b. More particularly an insulating layer 104 is formed on a semiconductor layer 102. At one end of the layer 104 is formed a diffused layer 103a while one electrode 109 of an information storage capacitor is provided at the other end of the layer 104 opposite to the location of the region 103a thereby forming the capacitor Ca. An inter-layer insulating film 125 is provided to cover the electrode 109 of the capacitor. On upper surfaces of this insulating film 125 and the insulating layer 104 there are integrally formed a word line 105A in read-out and a gate electrode 105B of a MOSFET excepting on that portion of the layer 104 which corresponds to the diffused region 103a. Thus constructed capacitor Ca is applied with a constant voltage Vc while the electrical charge is transferred to the capacitor Ca upon conduction of the MOSFET. Then an inversion layer or a deep depletion state is brought about at the surface of the semiconductor layer 102 in the capacitor Ca so that it is possible to control the width of a space charge layer similarly to the preceding embodiment. Therefore same kind of advantages as in FIG. 8 are also expected in this embodiment.

Figure 10:
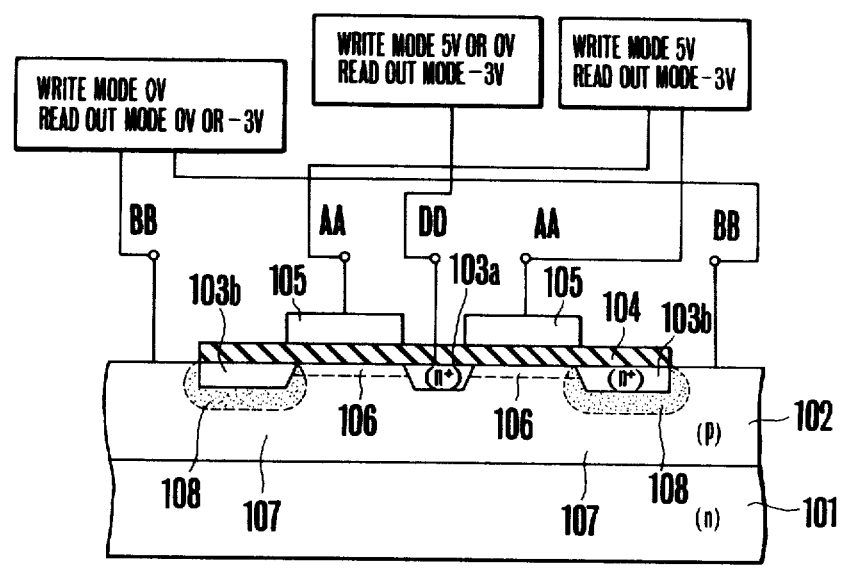

FIG. 10 shows still another embodiment of a semiconductor memory device according to the invention where same or similar parts to FIG. 1 are given with same reference characters to omit their explanations. This embodiment shows a structure in which two memory cells are arranged symmetrically to each other with a common terminal being centrally located. One N+ diffused region 103a and two N+ diffused regions 103b on both sides of the region 103a are formed in a P type semiconductor layer 102 provided on a N type semiconductor substrate 101. Gate electrodes 105 of MOSFET's are respectively provided via a gate insulating film 104 at surface portions of the P semiconductor layer 102 between the N+ diffused region 103a and the respective N+ diffused regions 103b, and are respectively connected to word line terminals AA in writing. On the P semiconductor layer 102 outside of the respective N+ diffused regions 103b there are provided two electrodes both being separated from the regions 103b and connected to word line terminals BB in read-out respectively. These electrodes, though not shown, are formed to make ohmic contacts to the P semiconductor layer 102 by the conventional processing. An electrode similarly formed on the N+ diffused region 103a is connected to a terminal DD of a bit line in writing and of a bit line in read-out.

To write an information into the above constructed semiconductor memory cell, the word line terminal BB in read-out is held at 0 V while the terminal DD of the write mode bit line and the read-out mode bit line is applied with either 5 V (when the information is "1") or 0 V (information "0"). Next the word line terminal AA of writing is applied with 5 V. Then, if the bit line/bit line terminal DD is in a state receiving 5 V, electrons flow away from the N+ diffused region 103b through a channel 106 of the MOSFET so that a space charge layer 108 formed around the region 103b expands enough to reach the boundary between the P semiconductor layer 102 and the N semiconductor substrate 101. As a result a buried channel 107 is pinched-off to be vanished which means an information "1" has been stored. Contrarily to this if the bit line/bit line DD is in a state of 0 V, the space charge layer 108 does not expand and therefore the buried channel is maintained.

To read-out an information from a selected cell, the word line terminal BB in read-out is held at 0 V and the word line terminal AA in writing is applied with −3 V. Then the bit line/bit line terminal DD is supplied with −3 V to provide a potential difference between the terminals BB and DD thereby detecting based on nonconduction or conduction between the both terminals whether the buried channel 107 has been vanished by the space charge layer 108 or maintained that is to read-out if the stored information is "1" or "0". The reason why the word line terminal AA is applied with −3 V in advance to the application of −3 V to the bit line/bit terminal DD is to avoid the MOSFET to be rendered conductive at the application of −3 V to the terminal DD. As for a non-selected cell the word line terminal BB is supplied with −3 V instead of 0 V.

Figure 11:
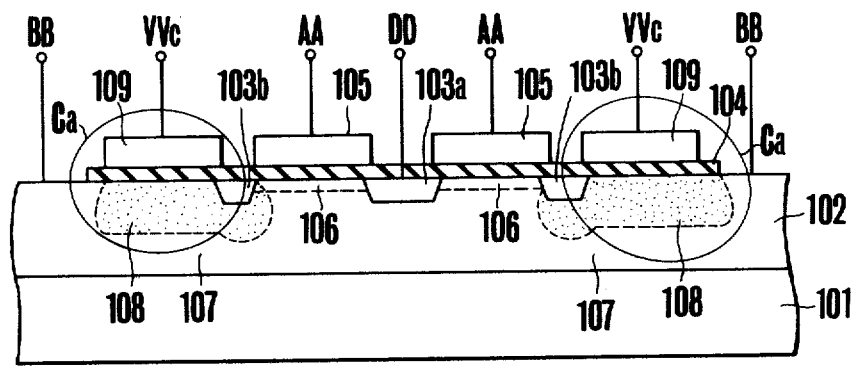

FIG. 11 is a sectional view showing a further embodiment of a semiconductor memory device according to the invention where same or similar parts to FIG. 10 are given with same reference characters to omit their explanations. One electrodes 109 of capacitors Ca connected to capacitor electrode terminals VVc are respectively provided via a gate insulating film 104 on surface portions of a P semiconductor layer 102 between N+ diffused regions 103b and electrodes connected to word line terminals BB in read-out. Similarly as in FIG. 8 voltages of, for example, 5 V constantly applied to the electrode terminals VVC facilitate to form space charge layers 108 so that surface portions of the P semiconductor layer 102 just below the one electrodes 109 of the capacitors Ca functions as charge storage regious. Excepting this point, writing and read-out of an information are carried out in a precisely same manner as in FIG. 10.

Figure 12:
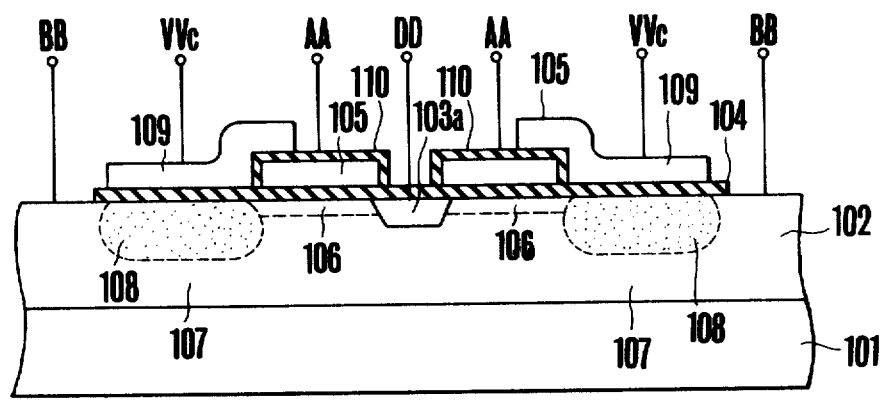

FIG. 12 is a sectional view of a further embodiment of a semiconductor memory device according to the invention where same or similar parts to FIG. 8 are given with same reference characters to omit their explanations. The N+ diffused region 103b in FIG. 8 is not provided in ths FIG. 12 and instead one electrodes 109 of capacitors serving as charge storage regions are formed to partially overlap gate electrodes 105 of MOSFET's via an insulating film 110. This omission of the N+ diffused region 103b provides not only reduction in channel resistance enabling further high speed operation but also increased freedom in structure designing of the thickness d and impurity concentration $N_A$ of the P semiconductor layer 102 which will be described later. The minimal value dmin for thickness d of the P semiconductor layer is so determined that the buried channel 107 can be formed at the "0" state in which the charge is not stored in the abovementioned charge storage region. On the other hand its maximal value dmax is determined so that the buried channel 107 may not be formed at the "1" state. The thickness d of the P semiconductor layer 102 is selected to be within the range from dmin to dmax.

The dmin and dmax in FIG. 12 are expressed as follows:

$$d\mathrm{min} = \sqrt{\frac{2K_{si} \cdot \epsilon_0 \cdot (2\phi_F)}{\zeta \cdot N_A}} \tag{2}$$

$$d\mathrm{max} = \sqrt{\frac{2K_{si} \cdot \epsilon_0 \cdot (2\phi_F + V_s)}{\zeta \cdot N_A}} \tag{3}$$

$$\phi_F = \frac{KT}{\zeta} \ln \frac{N_A}{n_i} \tag{4}$$

$$V_s = \alpha - \sqrt{\alpha^2 - \beta} \tag{5}$$

$$\alpha = V_w - V_{FB} - 2\phi_F + \frac{K_{si} \cdot \epsilon_0 \zeta N_A}{C_{ox}^2} \tag{6}$$

$$\beta = (V_w - V_{FB} - 2\phi_F)^2 - \frac{4K_{si} \cdot \epsilon_0 \zeta N_A \phi_F}{C_{ox}^2} \tag{7}$$

where Ksi Dielectric constant of silicon, ni Intrinsic impurity concentration, K Boltzman constant, T Absolute temperature, Vw information writing voltage, $V_{FB}$ Flatband voltage, and Cox capacitance of gate oxidization film.

The dmin in FIG. 11 is expressed by $$d\mathrm{min} = \sqrt{\frac{2K_{si} \cdot \epsilon_0 \cdot V_{bi}}{\zeta \cdot N_A}} \tag{8}$$

where $V_{bi}$ is Built-in potential, and $X_j$ depth of the diffused region 103b.

Figure 13:
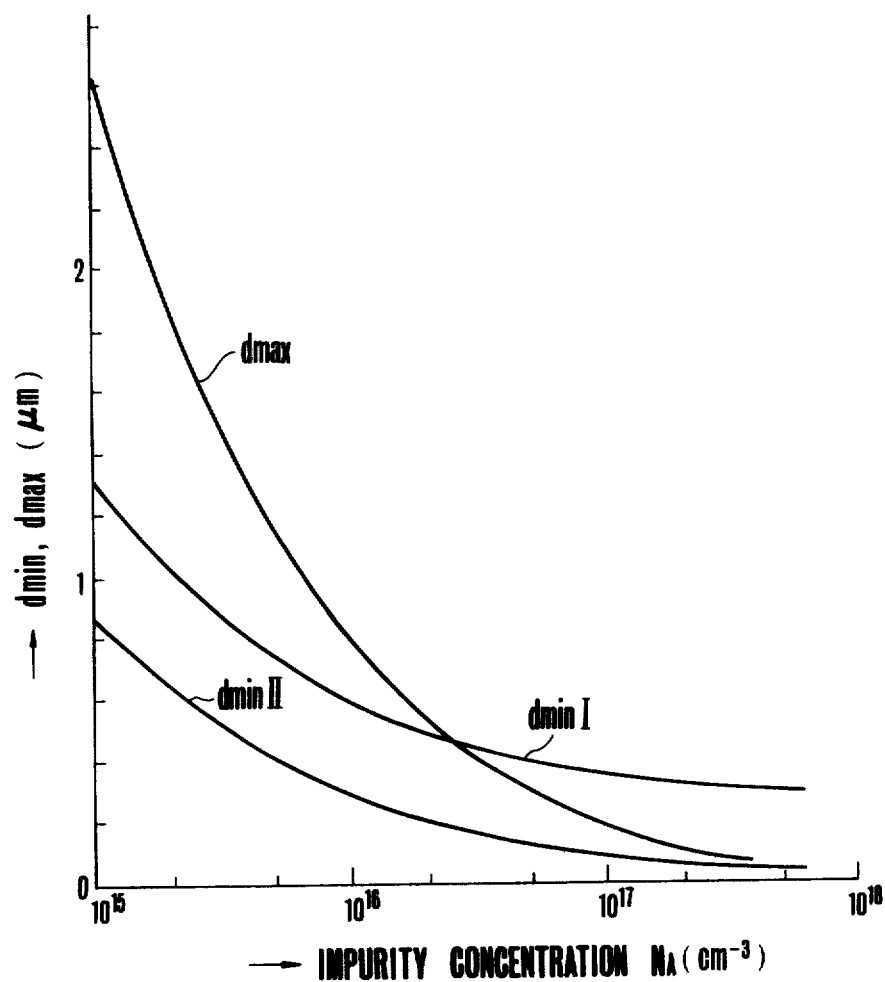
FIG. 13 is a graphic chart showing maximal values and minimal values of thickness of a semiconductor layer in relation to impurity concentration variation of such layer.

Next, in FIG. 13, variations of dmin and dmax are plotted in relation to variation of the impurity concentration $N_A$ of the P semiconductor layer 102 with an assumption that Vw, $V_{FB}$, Xj and thickness of the gate insulating film are 5 V, −0.95 V, 0.25 m and 300 Å respectively. In the Figure, dmax is a maximal value of thickness d of the P semiconductor layer 102 while dmin I and dmin II are its minimal values with and without the N+ diffused region 103b respectively. It will be apparent from this FIG. 13 that the designing freedom for thickness d and impurity concentration $N_A$ of the P semiconductor layer 102 is considerably augmented by eliminating the N+ diffused region 103b as in the embodiment of FIG. 12. Further, in FIG. 12, the charge storage capacitance that is capacitor area can be minimized to about one third of that of the conventional single-transistor memory cell and consequently the total cell area can be reduced to about two thirds of the conventional one in case of a 256 Kbit RAM. Even with the cell area of two thirds of the conventional ones, the memory cell of the invention is still capable of producing output signals of about three times greater than that of them.

Figure 14:
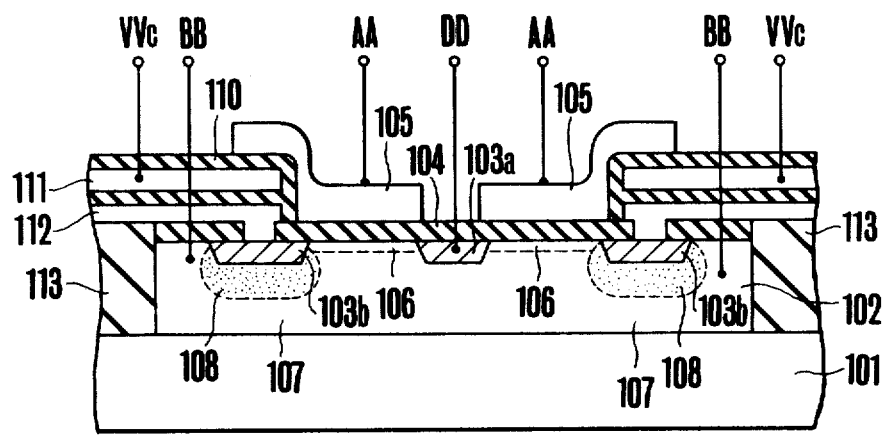
FIG. 14 is a modification of a semiconductor memory device according to the invention.

FIG. 14 is a sectional view of further modification of a memory cell according to the invention where same or similar parts to FIG. 11 are given with same reference characters to omit their explanations. This is an example that the charge storage regions are formed of stacked capacitors each comprising a pair of electrodes opposing to each other via an insulating film to constitute two electrodes of a capacitor. In this structure it is possible to form the capacitor partly on a surface of an insulating film which isolates the respective adjacent devices, thereby adroitly utilizing such area to further reduce an area occupied by each memory cell.

Figure 15:
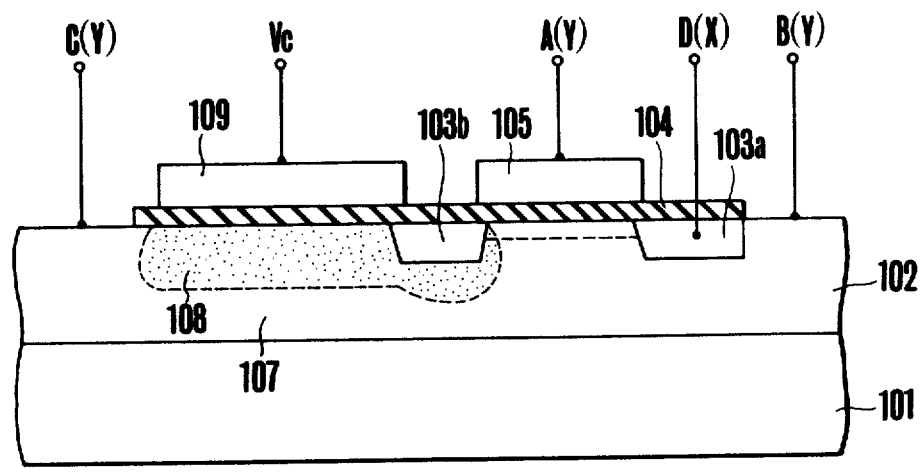
FIG. 15 is a view explaining a wiring manner of respective terminals in case of composing a memory array using the embodiment shown in FIG. 8.
Figure 16:
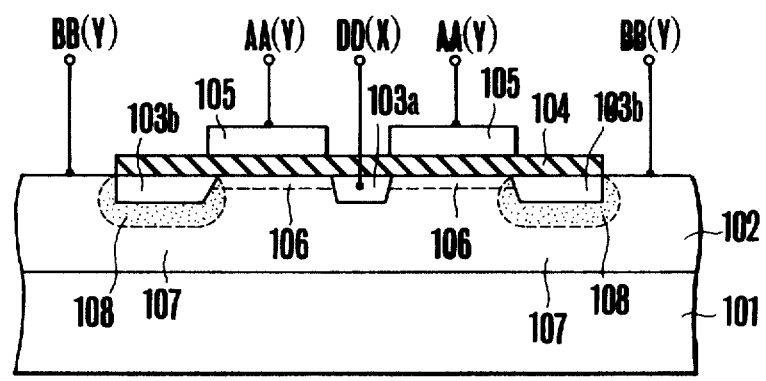
FIG. 16 is a view explaining a wiring manner of respective terminals in case of composing a memory array using the embodiment shown in FIG. 10.

Though in the preceding embodiments descriptions have been made with reference to operation of only one memory cell or a pair of memory cells arranged symmetrically, it is usual in practical use that the plentiful memory cells of the above described structure are arranged in a matrix. Such example is shown in FIG. 15 in which a memory cell array is constituted by the memory cells embodied in FIG. 8 with the wiring directions of the respective terminals being shown by X and Y. Read-out is carried out as described before by applying 0 V to the terminal D of the bit line in writing and the word line in read-out of a selected cell and 5 V to such terminals of non-selected cells. Similarly, wiring directions to constitute a memory cell array using the memory cells of FIG. 10 is shown in FIG. 16. Read-out of a selected cell is carried out by applying 0 V to the terminal BB of the word line in read-out and −3 V to such terminals of non-selected cells as described before.

Figure 17:
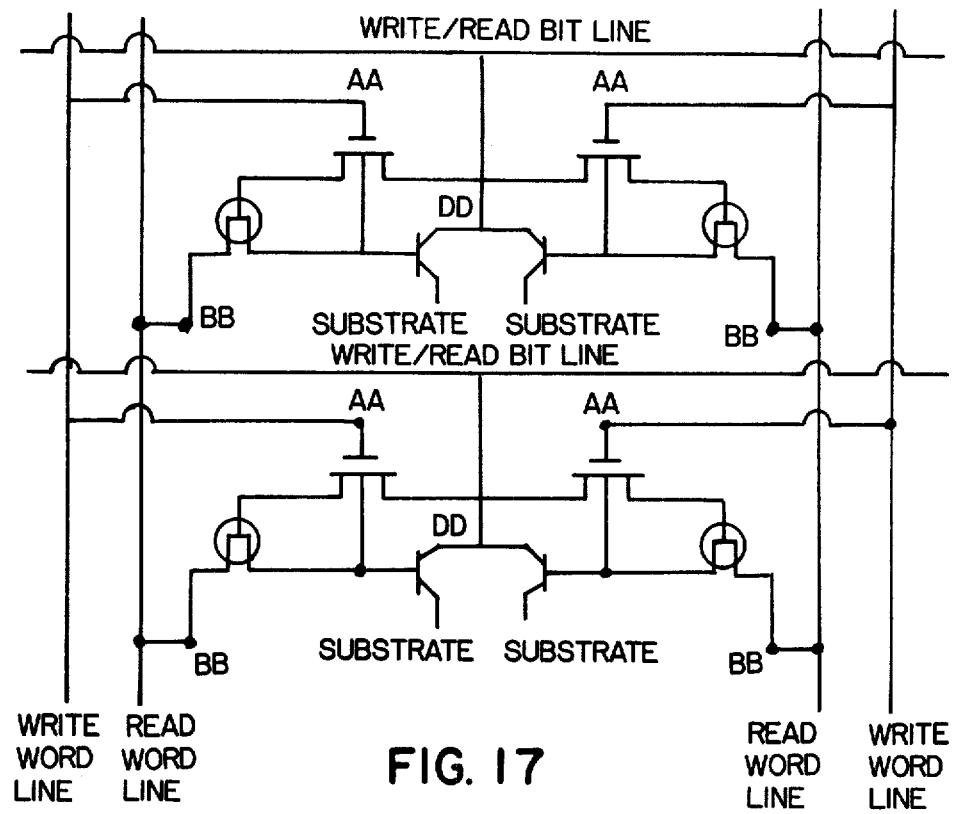
FIG. 17 is an equivalent circuit an array of memory cells according to this invention with a semiconductor substrate.
Figure 18:
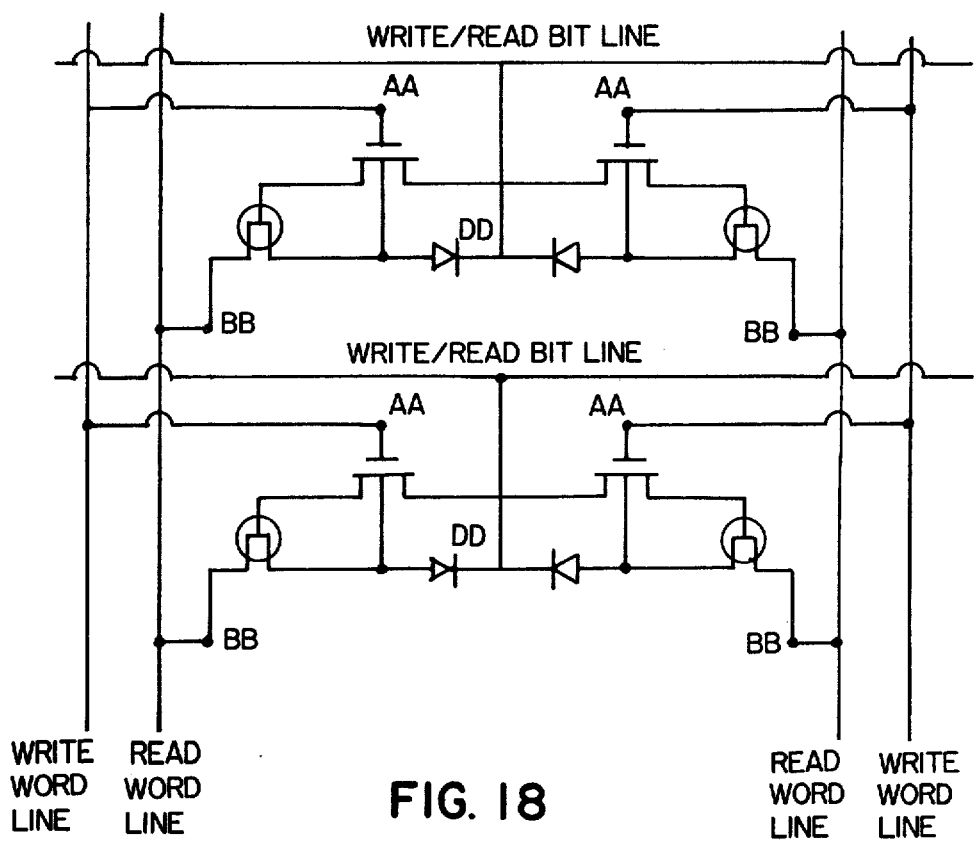
FIG. 18 is an equivalent circuit of an array of memory cells according to this invention with an insulating substrate.

FIGS. 17 and 18 are provided to show how the individual memory cells disclosed herein may be arranged into a memory array. FIG. 17 shows an equivalent circuit of a memory cell array with a semiconductor substrate and FIG. 18 shows an equivalent circuit of such a memory cell array with an insulating substrate.

In the FIG. 17 embodiment, the semiconductor substrate is of the second conductivity type, the first semiconductive region thereon being of the first conductivity type. Since the second conductor disposed in the first conductor region is also of the second conductivity type, a bipolar transistor is formed therebetween.

Normally, in integrated circuit technology, a semiconductor substrate in a first semiconductor region having different conductivity types are reversed biased for the purpose of separation. In the present invention also, the two are reverse biased. However, since the PN junction formed with the first semiconductor region and the second semiconductor region connected to the reading terminal is forward biased for reading, the structure functions as a bipolar transistor, the second semiconductor region being the emitter, the first semiconductor region being the base and the semiconductor substrate being the collector.

With reference to FIG. 18, a PN junction is not formed between a first semiconductor region and the substrate. There is instead a PN junction diode formed between the first semiconductor region and a second semiconductor region. The PN junction formed is used for reading by being forward biased as is the case in the equivalent circuit of FIG. 17 with a semiconductor substrate.

As seen from the above description, in a semiconductor memory device accordig to the invention, the read-out of information is carried out by detecting a current through a buried channel which current is varied by the width of a space charge layer formed in accordance with the stored charge and not by directly detecting the stored charge itself. Therefore a larger read-out signal is obtained than in the direct detection of the stored charge. Since it is also possible to constitute by a single concurrent terminal such two terminal of entirely different functions as a bit line terminal in writing and a bit line terminal in read-out, the number of wirings can be reduced to realize a memory circuit of higher packing density. It is further possible in the invention to shorten a distance between the read-out terminals which enables a higher operational speed due to reduced channel resistance and an increased read-out current. In case that a diffused region is eliminated between a MOSFET constituting the memory device and a MOS capacitor for storing an information, the channel resistance is further reduced to provide a higher operational speed and at the same time freedom of structure designing is enlarged in selecting a thickness of the semiconductor layer and an impurity concentration of the semiconductor substrate.

It is of course that the present invention is not limited to the described preferred embodiments but may be modified and applied in various ways. For example, though in the preceding embodiments N channel MOSFET in used, P channel type may be also used. In such a case, for example in FIG. 1, some obvious alterations are made so that the substrate 101 is P type, the semiconductor layer 102 is N type and that the diffused regions 103a and 103b are P+ type. The terminals B and C described in the embodiment of FIGS. 5 and 6 to be formed of the same semiconductor layer with the layer 102 may be formed of a semiconductor region having the same conductivity type and a higher impurity concentration than the layer 102 (P+ in this example). In the same embodiment of FIGS. 5 and 6 a DSA (Diffusion Self Aligned) type MOSFET may be used having a P+ semiconductor layer around the region 103a or 103b. The semiconductor substrate 101 in the described embodiments may be replaced by such an insulator substrate as silicon oxide, sapphire, spinnel, silicon nitride or the like. Similar operations and advantages to the described embodiments are available also in case of the insulator substrates. It will be further apparent that the means for detecting the presence of a buried channel formed between the space charge layer and the substrate may provided, for example in FIG. 1, in a direction perpendicular to the paper surface of the Figure with the buried channel 107 being interposed therebetween.

What is claimed is:
1. A semiconductor memory device comprising:
a substrate;
a first semiconductor region of a first conductivity type formed on said substrate;
a gate insulating film formed on said first semiconductor region;
a first gate electrode disposed on said gate insulating film;
a second semiconductor region of a second conductivity type formed in said first semiconductor region in relation with an end of said gate electrode;
a first charge storage portion formed apart from said second semiconductor region and in relation with the other end of said gate electrode; and
means for detecting conductivity of a buried channel formed between said substrate and a space charge layer which is formed in said first semiconductor region in accordance with an amount of electric charge supplied to said charge storage portion, said buried channel detecting means comprising a first external terminal connected to said second semiconductor region and a second external terminal connected to a portion of said first semiconductor region which is opposed to said gate electrode with said charge storage portion interposed therebetween, wherein the junction formed between said first and second semiconductor regions is forward biased during read-out.

2. A memory device according to claim 1, in which said substrate is an insulator substrate.

3. A memory device according to claim 2, in which said insulator substrate comprises one selected from a group of silicon oxide, sapphire, spinnel and silicon nitride.

4. A memory device according to claim 1, in which said substrate is a semiconductor substrate of said second conductivity type.

5. A memory device according to claim 1, in which said charge storage portion comprises a semiconductor region of said second conductivity type formed in said first semiconductor region.

6. A memory device according to claim 1, in which said charge storage portion comprises a metal-insulator semiconductor type capacitor having a capacitor electrode provided on said gate insulating film separately from said gate electrode and applied with a certain direct current voltage.

7. A memory device according to claim 6, in which said charge storage portion further comprises a third semiconductor region of said second conductivity type provided in said first semiconductor region under a portion of said gate insulating film which is interposed between said capacitor electrode and said gate electrode.

8. A memory device according to claim 6, in which said charge storage portion further comprises an inter-layer insulating film provided on said capacitor electrode, said gate electrode being spreading over said inter-layer insulating film.

9. A memory device according to claim 6, in which said charge storage portion further comprises an inter-layer insulating film provided on said gate electrode, said capacitor electrode being spreading over said inter-layer insulating film.

10. A memory device according to claim 1, further comprising a second gate electrode disposed on said gate insulating film to be symmetrical relative to said first electrode with said second semiconductor region being central so that the second gate electrode has one end located in connection with said second semiconductor region, and a second charge storage portion formed in relation with the other end of said second gate electrode wherein said detecting means further detects conductivity of a buried channel formed between said substrate and a space charge layer which is varied in said first semiconductor region in accordance with an amount of electric charge supplied to said second charge storage portion.

11. A memory device according to claim 10, in which each of said charge storage portions comprises a metal-insulator-semiconductor capacitor having a capacitor electrode provided on said gate insulating film separately from the corresponding gate electrode and applied with a certain constant voltage.

12. A memory device according to claim 10, in which each of said charge storage portions comprises a third semiconductor region of said second conductivity type provided in said first semiconductor region under a portion of said gate insulating film which is interposed between each ones of said capacitor electrodes and said gate electrodes.

13. A memory device according to claim 10, in which each of said charge storage portions comprises a semiconductor region of said second conductivity type provided in said first semiconductor region.

* * * * *